United States Patent [19]

Torikai

[11] Patent Number: 5,665,982
[45] Date of Patent: Sep. 9, 1997

[54] SEMICONDUCTOR PHOTO-DEVICE HAVING OBLIQUE TOP SURFACE OF STEM FOR ELIMINATING STRAY LIGHT

[75] Inventor: Masahiro Torikai, Tokyo, Japan

[73] Assignee: NEC Corporation, Tokyo, Japan

[21] Appl. No.: 504,673

[22] Filed: Jul. 20, 1995

[30] Foreign Application Priority Data

Jul. 21, 1994 [JP] Japan .................................. 6-190957

[51] Int. Cl.⁶ .................................................. H01L 27/15
[52] U.S. Cl. .................... 257/81; 257/80; 257/82; 257/98; 257/99
[58] Field of Search .......................... 257/80, 81, 82, 257/98, 99

[56] References Cited

U.S. PATENT DOCUMENTS

| | | | |
|---|---|---|---|
| 4,119,363 | 10/1978 | Cainlibel et al. | 257/99 |
| 5,296,724 | 3/1994 | Ogata et al. | 257/99 |

FOREIGN PATENT DOCUMENTS

| | | | |
|---|---|---|---|
| 59-193080 | 11/1984 | Japan | 257/99 |
| 3-114278 | 5/1991 | Japan | 257/99 |

OTHER PUBLICATIONS

European Patent Application No. 0 210 582, published Feb. 4, 1987., Shikama et al.

Patent Abstracts of Japan; No. JP-A-01 024488, May 16, 1989; vol. 13, No. 207., Haruo et al.

Patent Abstracts of Japan; No. JP-A-61 054689, Jul. 29, 1986; vol. 10, No. 217., Sugano.

Patent Abstracts of Japan; No. JP-A-04 150085 May 22, 1992; vol. 16, No. 429., Shusuke.

Patent Abstracts of Japan; No. JP-A-03 114278; May 15, 1991; vol. 15, No. 315., Hidehiko et al.

Primary Examiner—Minh-Loan Tran
Attorney, Agent, or Firm—Sughrue, Mion, Zinn, Macpeak and Seas

[57] ABSTRACT

A semiconductor laser emitting device has a semiconductor laser emitting diode mounded on a heat sink attached to a side surface of a heat conductive stem accommodated in a package; and a top surface of the stem is oblique with respect to the optical path of a laser beam, roughened and topographically coated with an anti-reflecting film so as to drastically decrease a stray light.

6 Claims, 7 Drawing Sheets

SEMICONDUCTOR PHOTO-DEVICE HAVING OBLIQUE TOP SURFACE OF STEM FOR ELIMINATING STRAY LIGHT

FIELD OF THE INVENTION

This Invention relates to a semiconductor laser emitting device and, more particularly, to a semiconductor laser emitting device having a stem with an edge surface declining with respect to an emitting light for preventing an object from a stray light.

DESCRIPTION OF THE RELATED ART

Figure 1:
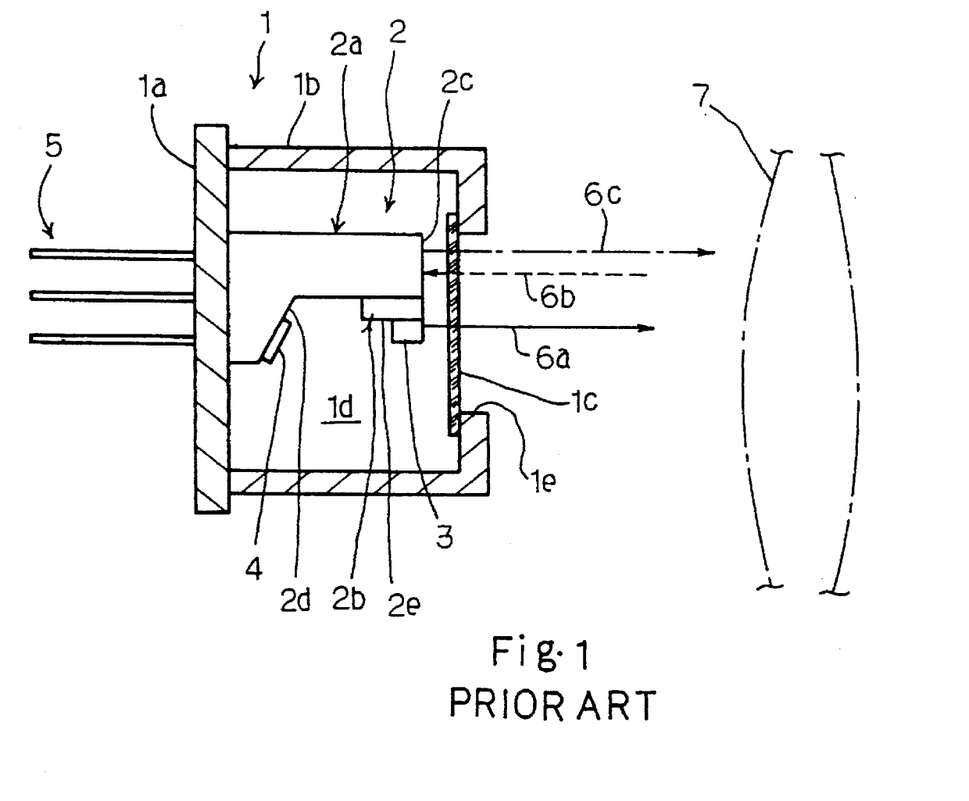
FIG. 1 is a cross sectional view showing the prior art semiconductor laser emitting device.

A typical example of the semiconductor laser emitting device is illustrated in FIG. 1 of the drawings. The prior art semiconductor laser emitting device largely comprises a package 1, a supporting structure 2, semiconductor photo-elements 3 and 4 and conductive leads 5 for energizing the semiconductor photo-elements 3 and 4.

The package 1 includes a base member 1a, a cap member 1b and a transparent window 1c. The base member 1a is fixed to the cap member 1b, and an internal space 1d is defined by the base member 1a and the cap member 1b. An opening 1e is formed in the cap member 1b, and the transparent window 1c closes the opening 1e.

The supporting structure 2 includes a stem 2a fixed to the base member 1a and a heat sink 2b attached to the stem 2a. The bottom surface of the stem 2a is flat, and is held in contact with the base member 1a. The side surfaces are perpendicular to the bottom surface, and the stem 2a has two top surfaces 2c and 2d. The top surface 2c is in parallel to the bottom surface and, accordingly, the base member 1a, and the other top surface 2d declines with respect to the base member 1a. The heat sink 2b is fixed to one of the side surfaces, and has a major surface 2e perpendicular to the base member 1a.

The semiconductor photo-elements 3 and 4 are a laser emitting diode and a photo-detecting diode, respectively, and the conductive leads 5 supply electric power to the laser emitting diode 3 and the photo-detecting diode 4. The laser emitting diode 3 is attached to the major surface 2e of the heat sink 2b, and forwardly radiates a laser beam 6a through the transparent window 1c. The laser beam 6a is parallel to the major surface 2e and, accordingly, perpendicular to the base member 1a.

The photo-detecting diode 4 is attached to the oblique top surface 2d, and monitors the laser light backwardly radiated from the laser emitting diode 3. The reason why the photo-detecting diode 4 is attached to the oblique top surface 2d is to prevent the photo-detecting diode 4 from reflecting light. The photo-detecting diode attached to the oblique surface 2d is described in Japanese Patent Publication of Unexamined Application No. 3-114278.

The prior art semiconductor photo-device behaves as follows. When the electric power is supplied through the conductive leads 5 to the laser emitting diode 3 and the photo-detecting diode 4, the laser emitting diode 3 is stimulated, and forwardly radiates the laser beam 6a. The laser beam 6a proceeds to an object, and is directly or indirectly used in a signal processing. An optical measuring apparatus, an optical information processing system and a laser pointer are examples of the object.

The laser emitting diode 3 further radiates the laser beam backwardly, and the backwardly radiated laser beam is incident into the photo-detecting diode 4. The photo-detecting diode 4 converts the laser beam to an electric signal indicative of the intensity of the laser, and supplies the electric signal to a controlling circuit for regulating the electric power. Thus, the photo-detecting diode 4 monitors the laser emission, and cooperates with the controlling circuit so as to stabilize the laser emitting diode 3.

The prior art semiconductor photo-device encounters a problem in a stray light. In detail, whale the laser emitting diode 3 is radiating the laser beam 6a, the laser beam 6a is partially reflected by various optical elements such as a lens 7 provided on the optical path of the laser beam 6a, and the reflected light 6b returns to the top surface 2c of the stem 2a. The reflected light 6b is perpendicularly incident on the top surface. 2c, and the top surface 2c reflects the light 6b again. For this reason, a stray light 6c is radiated from the top surface 2c toward the object. The stray light 6c is differently focused, and the stray light 6c destroys the accuracy of the object.

SUMMARY OF THE INVENTION

It is therefore an important object of the present invention to provide a semiconductor photo-device which radiates a light beam without a stray light.

To accomplish the object, the present invention proposes to delete a top surface perpendicular to a reflected light.

In accordance with the present invention, there is provided a semiconductor photo-device comprising: a package having a non-transparent wall member and a transparent window member for forming in combination an internal space; a semiconductor photo-emitting element provided in the internal space and having a photo-radiating surface for radiating a light beam through the transparent window member toward an object outside of the package; and a stem fixed to the non-transparent wall member in the internal space and supporting the semiconductor photo-emitting element, the stem having a top surface opposed to the transparent window member and declining at a predetermined angle with respect to an optical path of the light beam so as to prevent the object from a stray light reflecting on the top surface.

BRIEF DESCRIPTION OF THE DRAWINGS

The features and advantages of the semiconductor photo-device according to the present invention will be more clearly understood from the following description taken in conjunction with the accompanying drawings in which.

DESCRIPTION OF THE PREFERRED EMBODIMENTS

First Embodiment

Figure 2:
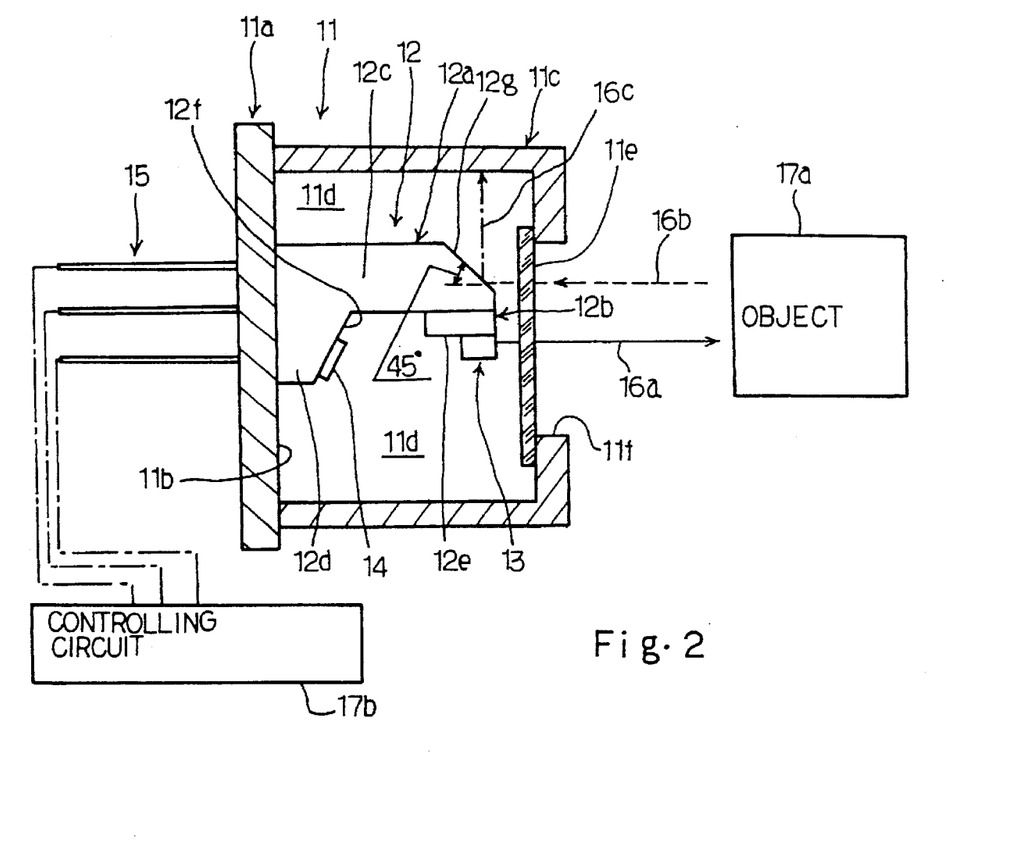
FIG. 2 is a cross sectional view showing the structure of a semiconductor laser emitting device according to the present invention.

Referring to FIG. 2 of the drawings, a semiconductor laser emitting device embodying the present invention largely comprises a package 11, a supporting structure 12 hermetically sealed in the package 11, semiconductor photo-elements 13 and 14 attached to the supporting structure 12 and conductive pins 15 projecting from the package 11. The semiconductor laser emitting device radiates a laser beam 16a toward an object 17a under the control of a controlling circuit 17b, and the object 17a directly or indirectly uses the laser beam 16a. An optical element such as a condenser lens (not shown) is provided on the optical path of the laser beam 16a, and reflects a part of the laser beam 16a. The reflected light 16b generated from the part of the laser beam 16a returns to the semiconductor laser emitting device in parallel to the laser beam 16a. The object 17a may be an optical measuring apparatus, an optical information processing system or a laser pointer.

The package 11 includes a base member 11a having a flat major surface 11b, a cap member 11c fixed to the base member 11a for forming an internal space 11d and a transparent window 11e closing an opening 11f formed in the cap member 11c. The transparent window 11e is formed of glass. Both of the base member 11a and the cap member 11c are formed of non-transparent material.

The supporting structure 12 includes a stem 12a and a heat sink 12b. A high-rise portion 12c and a low-rise portion 12d form the stem 12a, and a flat bottom surface of the stem 12a is attached to the flat surface 11b of the base member 11a. The stem 12a is formed of a thermally conductive substance such as copper, and radiates heat transferred from the semiconductor photo-element 13 through the heat sink 12b.

The high-rise portion 12c and the low-rise portion 12d have side surfaces extending in perpendicular to the flat surface 11b of the base member 11a, and the heat sink 12b is attached to one of the side surfaces of the high-rise portion 12c.

The heat sink 12b has a major surface 12e extending in parallel to the side surface and, accordingly, in perpendicular to the flat surface 11b of the base member 11a. The semiconductor photo-element 13 is a laser emitting diode, and is attached to the major surface 12e of the heat sink 12b. The laser emitting diode 13 forwardly radiates the laser beam 16a, and the optical path of the laser beam 16a is in parallel to the major surface 12e of the heat sink 12b.

While the laser emitting diode 13 is being stimulated, the laser emitting diode 13 generates the heat, and the heat is transferred through the heat sink 12b to the stem 12a as described hereinbefore.

A top surface 12f forms a part of the low-rise portion 12d, and declines with respect to the optical path of the laser beam 16a. The other semiconductor photo-element 14 is a photo-detecting diode, and is attached to the top surface 12f. The photo-detecting diode 14 converts a backward laser beam (not shown) to an electric signal indicative of the intensity of the backward laser beam, and the electric signal is supplied through one of the conductive pins 15 to the controlling circuit 17b. The controlling circuit 17b controls the electric power supplied through others of conductive pins 15 to the laser emitting diode 13, and stabilizes the light output power of the laser emitting diode 13.

The high-rise portion 12c also has a top surface 12g declining ah 45 degrees with respect to the optical path of the laser team 16a, and the reflectivity of the top surface 12g is about 5 percent.

When the laser emitting diode 13 is energized, the laser beam 16a is radiated through the transparent window 11e toward the object 17a, and the reflected light 16b incident onto the top surface 12g. The top surface 12g reflects the light 16b toward the inner wall of the case member 11c, and the reflected light 16c repeats reflection in the internal space 11d, and is attenuated during the multiple reflection. As a result, a stray light is drastically decreased.

The present inventor confirmed the substantial decrease of the stray light through a visual test. The ratio of the stray light to the output laser beam was 10 percent for the prior art. On the other hand, the ratio of the stray light to the output laser beam was 1 percent for the first embodiment.

As will be understood from the foregoing description, the oblique top surface 12g is effective against the stray light, and the object 17a exactly responds to the laser beam 16a only.

Second Embodiment.

Figure 3:
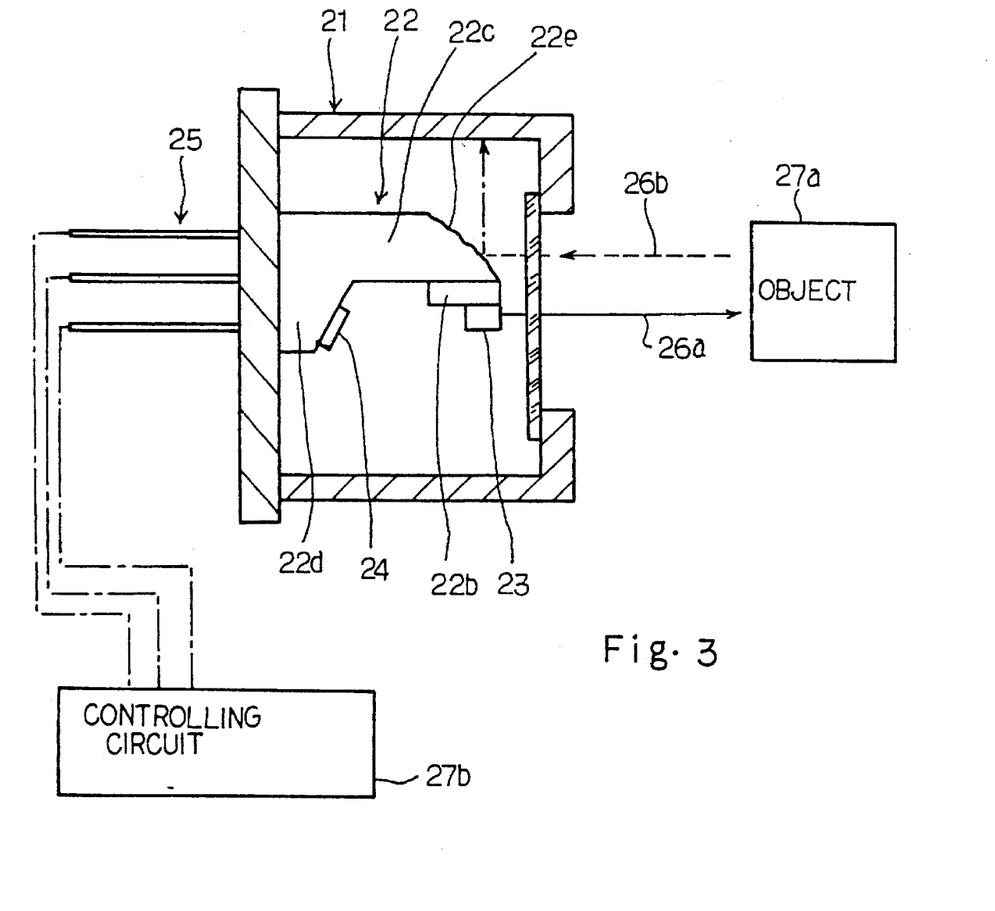
FIG. 3 is a cross sectional view showing the structure of another semiconductor laser emitting device according to the present invention.

Turning to FIG. 3 of the drawings, another semiconductor laser emitting device embodying the present invention also largely comprises a package 21, a supporting structure 22, a semiconductor laser emitting element 23, a semiconductor photo-detecting element 24 and conductive pins 25, and the semiconductor laser emitting element 23 radiates a laser beam 26a to an object 27a under the control of a controlling circuit 27b. The package 21, the semiconductor laser emitting element 23, the semiconductor photo-detecting element 24, the conductive pins 25, the object 37a and controlling circuit 27b are similar to those of the first embodiment, and description is omitted for the sake of simplicity.

The supporting structure 22 includes a stem 22a and a heat sink 22b, and the stem 22a has a high-rise portion 22c and a low-rise portion 22a. The heat sink 22b is similar to the heat sink 12b; however, the stem 22a is slightly different from the stem, 12a. The difference is a top surface 22e of the high-rise portion 22c. Although the top surface 22e also declines at 45 degrees with respect to the optical path of the laser beam 26a, the top surface 22e is roughened. In this instance, the reflecting light 26b is effectively scattered on the top surface 22e.

The present-inventor evaluated the semiconductor laser emitting device shown in FIG. 3 under the same conditions as the first embodiment. The ratio of the stray light to the laser beam 26a was less than 1 percent, and the rough top surface 22e was surely effective against the stray light.

Third Embodiment

Figure 4:
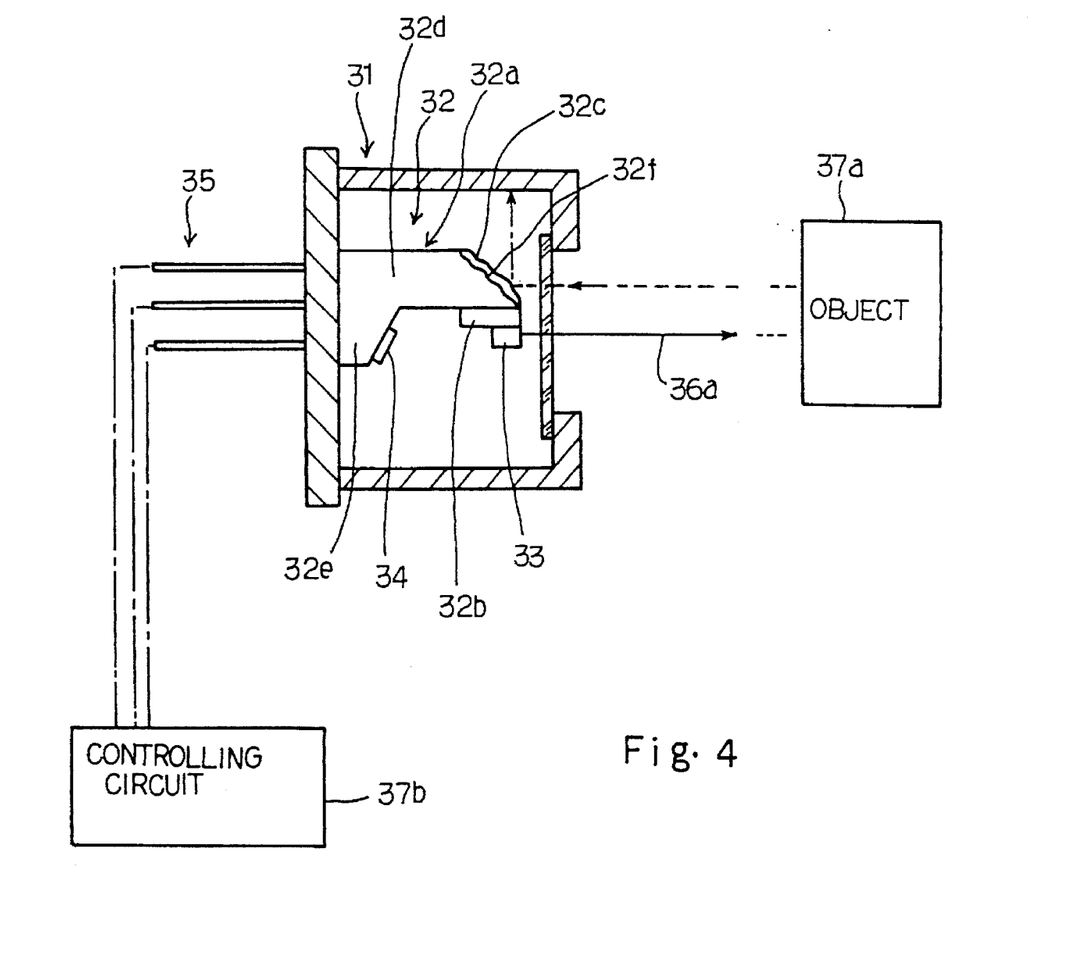
FIG. 4 is a cross sectional view showing the structure of a semiconductor laser emitting device according to the present invention.

Turning to FIG. 4 of the drawings, yet another semiconductor laser emitting device embodying the present invention also largely comprises a package 31, a supporting structure 32, a semiconductor laser emitting element 33, a semiconductor photo-detecting element 34 and conductive pins 35, and the semiconductor laser emitting element 33 radiates a laser beam 36a to an object 37a under the control of a controlling circuit 37b. The package 31, the semiconductor laser emitting element 33, the semiconductor Photo-detecting element 34, the conductive pins 35, the object 37a and controlling circuit 37b are similar to those of the first embodiment, and description is omitted for the sake of simplicity.

The supporting structure 32 includes a stem 32a, a heat sink 32b and an anti-reflecting film 32c. The stem 32a has a high-rise portion 32d and a low-rise portion 32e, and a top surface 32f of the high-rise portion 32d declines at 45 degrees with respect to the optical path of the laser beam 36a. The top surface 32f is roughened, and the surface roughness is equal to that of the second embodiment.

The anti-reflecting film 32c is formed of nitride topographically deposited on the top surface 32f to 1000 angstroms thick, and the surface roughness of the top surface 32f is transferred to the anti-reflecting film 32c. The reflectivity of the anti-reflecting film 32c is 2 percent.

The present inventor evaluated the semiconductor laser emitting device implementing the third embodiment under the same conditions of the first embodiment. The ratio of the stray light to the laser beam 36a was less that 1 percent, and the anti-reflecting film 32f was effective against the stray light.

Fourth Embodiment

Figure 5:
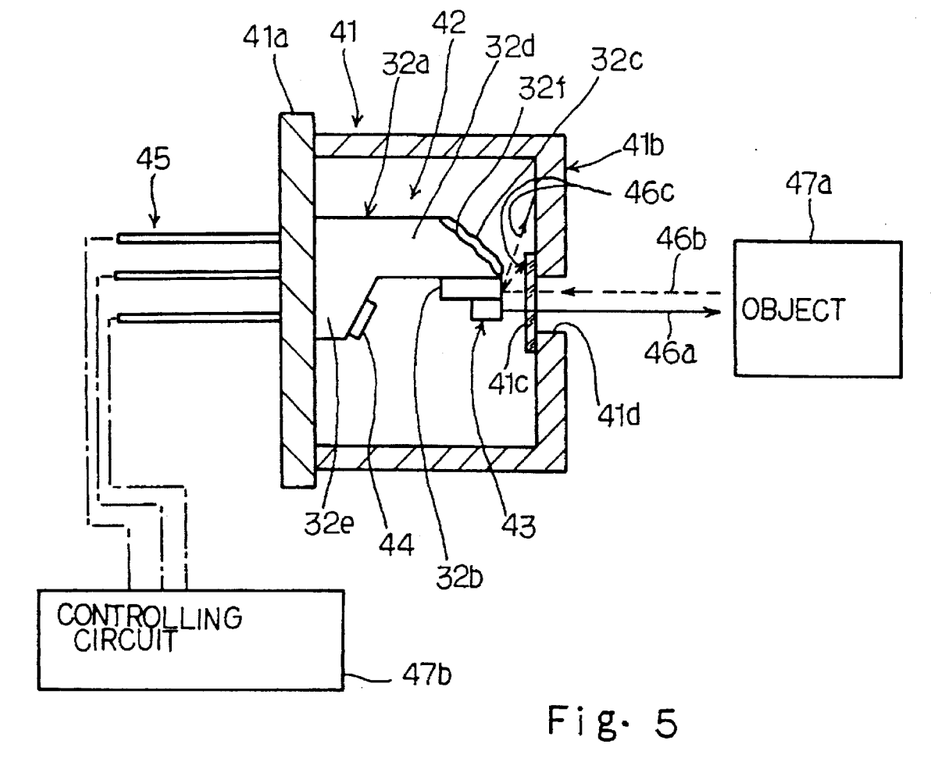
FIG. 5 is a cross sectional view showing the structure of another semiconductor laser emitting device according to the present invention.

Turning to FIG. 5 of the drawings, still another semiconductor laser emitting device embodying the present invention also largely comprises a package 41, a supporting structure 42, a semiconductor laser emitting element 43, a semiconductor photo-detecting element 44 and conductive pins 45, and the semiconductor laser emitting element 43 radiates a laser beam 46a to an object 47a under the control of a controlling circuit 47b. The supporting structure 42, the semiconductor laser emitting element 43, the semiconductor photo-detecting element 44, the conductive pins 45, the object 47a and controlling circuit 47b are similar to those of the third embodiment, and description is omitted for the sake of simplicity. The essential portions and parts of the supporting structure 42 are labeled with the same references designating the corresponding portions and parts of the supporting structure 32.

The package 41 includes a base member 41a, a cap member 41b and a transparent window 41c of glass. The base member 41a and the cap member 41b are formed of non-transparent material. The base member 41a is similar to that of the first embodiment, and an opening 41d is also formed in the cap member 49b, and the transparent window 41c closes the opening 49d.

The opening 41d is optimized with respect to the laser beam 46a. Although the opening 41d allows the laser beam 46a to be radiated therethrough without reflection on the periphery of the cap member 41b defining the opening 41d, the area of the opening 41d is as narrow as possible. For this reason, even if the reflecting light 46b is incident into the internal space of the package 41, reflecting light 46c tends to be confined in the internal space. In this instance, the diameter of the laser beam 46a is about 3 millimeter, and the diameter of the opening 41d is 1 millimeter.

The present inventor measured the stray light under the same conditions of the first embodiment, and the ratio of the stray light to the laser beam 46a was less than 1 percent.

Fifth Embodiment

Figure 6:
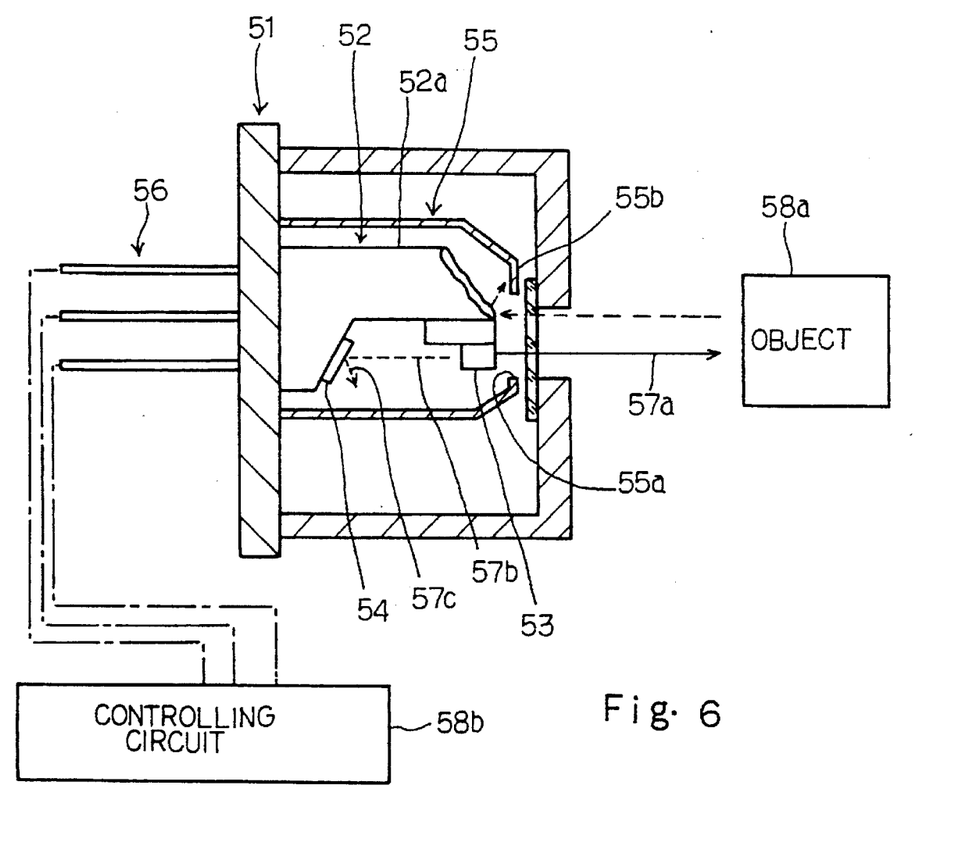
FIG. 6 is a cross sectional view showing the structure of yet another semiconductor laser emitting device according to the present invention.

Turning to FIG. 6 of the drawings, another semiconductor laser emitting device embodying the present invention also largely comprises a package 51, a supporting structure 52, a semiconductor laser emitting element 53, a semiconductor photo-detecting element 54, a guard wall member 55 and conductive pins 56, and the semiconductor laser emitting element 53 radiates a laser beam 57a to an object 58a under the control of a controlling circuit 58b. The package 51, the supporting structure 52, the semiconductor laser emitting element 53, the semiconductor photo-detecting element 54, the conductive pins 56, the object 58a and controlling circuit 58b are Similar to those of the third embodiment, and description is omitted for the sake of simplicity.

The guard wall member 55 is generally cylindrical, and formed of non-transparent material. An opening 55a is formed of a top surface 55b of the guard wall member and the laser beam 57a passes through the opening without reflection on the periphery of the top surface 55b defining the opening 55a. In this instance, the laser beam 57a is equal in diameter to the laser beam 46a, and the diameter of the opening 55a is adjusted to 1 millimeter.

If the guard wall member 55 is not provided around the stem 52a, the backward laser light 57b is partially reflected on the semiconductor photo-detecting element 54, and the reflected light 57c forms part of the stray light. The guard wall member 55 aims at confinement of the reflected light 57c, and can effectively decrease the stray light.

The prevent inventor evaluated the semiconductor laser emitting device implementing the fifth embodiment under the same conditions as the first embodiment. The ratio of the stray light to the laser beam 57a was less than 1 percent, and confirmed that the guard wall member 55 was effective against the stray light.

Sixth Embodiment

Figure 7A:
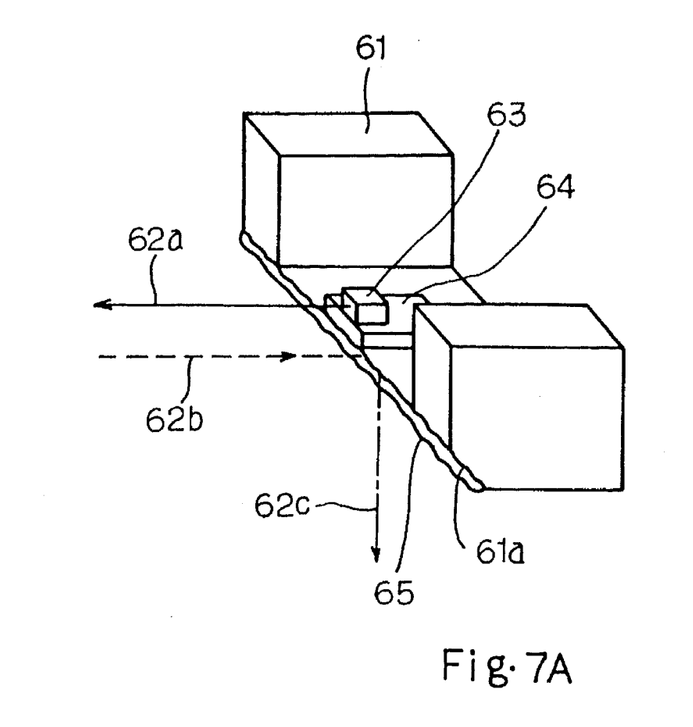
FIG. 7A is a perspective view showing essential parts of still another semiconductor laser emitting device according to the present invention.
Figure 7B:
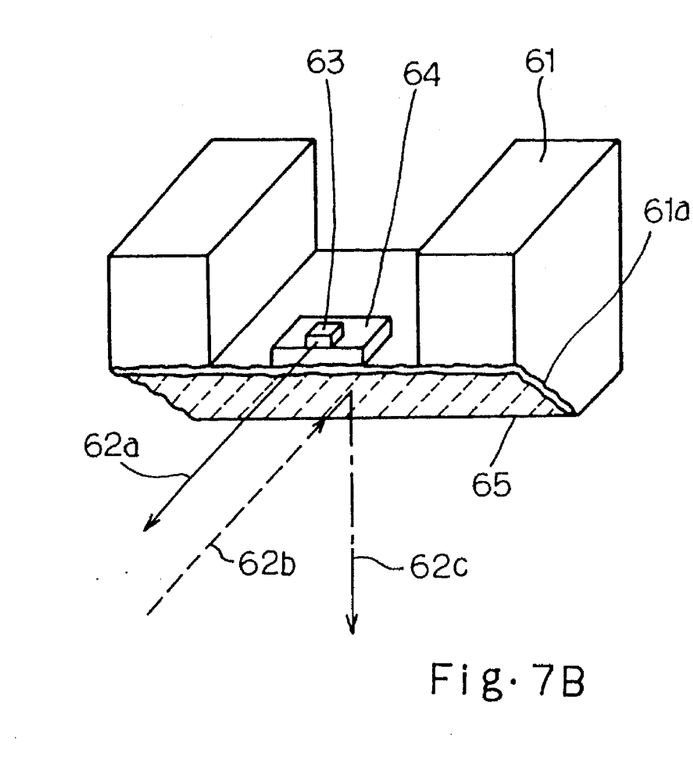
FIG. 7B is a perspective view showing the semiconductor laser emitting device at a different angle from FIG. 5A.

FIGS. 7A and 7B illustrate yet another semiconductor laser emitting device embodying the present invention. As shown in the figures, a stem 61 of a chip-on-carrier is obliquely cut at 45 degrees with respect to the optical path of a laser beam 62a, and a semiconductor laser emitting element 63 is attached to a heat sink 64 mounted on the stem 61. The oblique surface 61a of the stem 61 is roughened, and an anti-reflecting film 65 is topographically deposited on the oblique surface 61a.

A reflecting light 62b reflects on the anti-reflecting film 65, and proceeds as indicated by arrow 62c. For this reason, the stray light is drastically decreased.

Although particular embodiments of the present invention have been shown and described, it will be obvious to those skilled in the art that various changes and modifications may be made without departing from the spirit and scope of the present invention. For example, the photo-detecting element may not be incorporated in the semiconductor laser emitting device according to the present invention, and another optical element and/or an electrical component may be further integrated in the package.

Moreover, the angle between the oblique surface and the optical path of the laser beam is not limited to 45 degrees. Even if the angle is less than 45 degrees, the stray light is decreased through a multiple reflection inside of the package.

Especially, when the oblique surface is roughened and/or covered with an anti-reflecting film, the angle less than 45 degrees can effectively decrease the ratio of the stray light to the laser beam.

Finally, the transparent window may be a lens unit, and the anti-reflecting film may coat a smooth top surface of a step.

What is claimed is:

1. A semiconductor photo-device comprising:

a package having a non-transparent wall member and a transparent window member for forming in combination an internal space;

a semiconductor photo-emitting element provided in said internal space and having a photo-radiating surface for radiating a visual light beam through said transparent window member toward an object outside of said package; and a stem fixed to said non-transparent wall member in said internal space and supporting said semiconductor photo-emitting element, said stem having a top surface opposed to said transparent window member and declining at 45 degrees with respect to a virtual surface perpendicular to an optical path of said visual light beam so as to prevent said object from a stray light reflecting on said top surface.

2. The semiconductor photo-device as set forth in claim 1, in which said top surface is roughened so as to scatter a reflecting light incident into said internal space.

3. The semiconductor photo-device as set forth in claim 2, further comprising an anti-reflecting film topographically coating said top surface roughened for absorbing and scattering said reflecting light.

4. The semiconductor photo-device as set forth in claim 1, in which said top surface is coated with an anti-reflecting film.

5. The semiconductor photo-device as set forth in claim 1, further comprising a semiconductor photo-detecting element attached to an oblique surface of said stem for detecting another light beam radiated from said semiconductor photo-emitting element in a different direction from said visual light beam, and a guard wall member surrounding at least said semiconductor photo-detecting element so as to confine a reflecting light of said another light beam in an inner space defined therein.

6. The semiconductor photo-device as set forth in claim 1, in which said transparent window member is decreased in area to a limit where said laser beam passes through said transparent window member without a reflection on a periphery of said non-transparent member.

* * * * *